(12) United States Patent
Boerner et al.

(10) Patent No.: US 6,350,534 B1
(45) Date of Patent: Feb. 26, 2002

(54) ORGANIC LIGHT-EMITTING DIODE WITH TERBIUM COMPLEX

(75) Inventors: Herbert Boerner, Aachen; Wolfgang Busselt, Roetgen; Thomas Jüstel; Hans Nikol, both of Aachen, all of (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/213,610

(22) Filed: Dec. 17, 1998

(30) Foreign Application Priority Data

Dec. 18, 1997 (DE) .......................................... 197 56 361

(51) Int. Cl.$^7$ .............................................. H05B 33/14
(52) U.S. Cl. ...................... 428/690; 428/704; 428/917; 313/504; 313/506; 257/94
(58) Field of Search ................................ 428/690, 704, 428/917; 313/498, 499, 502, 503, 504, 506; 257/94, 101, 102, 103

(56) References Cited

U.S. PATENT DOCUMENTS 5,756,224 A * 5/1998 Börner et al. ................ 428/690

FOREIGN PATENT DOCUMENTS

DE       4428450 A1    2/1996

OTHER PUBLICATIONS

1998: 131515 ZCAPLUS (Doc. No. 128:236499)—Abstract for "Resonance Raman Spectroscopic Study of Phenoxyl Radical Complexes", R. Schnepf et al., J. Am. Chem. Soc. 120(10), 2352–2364, 1998, (No month).*

"Luminescence Properties of EU3+, TB3+, and Gd3+ Complexes of the Hexadentate N–Donor Podand Tris—[3–(2–Pyridyl) Pyrazol—Lyl]Hydroborate", by Nicola Armaroli et al, Chemical Physics Letters, pp. 435–440, Sep. 26, 1997.

"Organic Photoreceptors for Imaging Systems", by Paul M. Borsenberger et al, Marcel Dekker, Inc., New York, 1993, pp. 181–183, 190–211, (No month).

* cited by examiner

*Primary Examiner*—Marie Yamnitzky
(74) *Attorney, Agent, or Firm*—Ernestine C. Bartlett; Norman N. Spain

(57) ABSTRACT

An organic light-emitting diode comprising a laminated structure including, in succession, a substrate layer, a first electrode layer, a layer including a p-conductive material, a layer including a complex compound of terbium with organic ligands, a layer including an n-conductive material and a second electrode, the complex compound of terbium with organic ligands having the following composition: $TbL(C_2H_5OH)_2$, wherein L=N,N',N"-Tris-(3-$R_1$—,5-$R_2$-2-X-benzyl)-1,4,7-triazacyclononane, wherein X=—O—, —COO—, $R_1$=$CH_3$, $C_2H_5$, $C_3H_7$, i-$C_3H_7$, t-$C_4H_9$, $OCH_3$, $OC_2H_5$, $OC_3H_7$, $O'C_4H_9$, F, Cl, Br, $NO_2$ and $R_2$=$CH_3$, $C_2H_5$, $C_3H_7$, i-$C_3H_7$, t-$C_4H_9$, $OCH_3$, $OC_2H_5$, $OC_3H_7$, $O'C_4H_9$, F, Cl, Br, $NO_2$.

6 Claims, 2 Drawing Sheets

ORGANIC LIGHT-EMITTING DIODE WITH TERBIUM COMPLEX

BACKGROUND OF THE INVENTION

The invention relates to an organic light-emitting diode for luminous displays, luminaires, solid-state image intensifiers, color monitors, color display screens and the like, which diode comprises a laminated composite comprising, in succession, a substrate layer, a first electrode layer, a layer including a p-conductive organic material, a layer including a complex compound of terbium with organic ligands, a layer including an n-conductive material and a second electrode.

Light-emitting diodes (LED) in accordance with the state of the art generally are semiconductor diodes, that is diodes which are constructed by means of inorganic semiconductors, such as doped zinc sulphide, silicon, germanium, or III–V semiconductors, such as InP, GaAs, GaAlAs, GaP or GaN containing appropriate dopings. Since a number of years, efforts are being made to develop luminescent radiation sources whose emitter material is not an inorganic semiconductor yet an organic, electroconductive material.

Light-emitting diodes comprising luminous layers of organic materials are clearly superior, in some respects, to light sources of inorganic materials. One advantage is that they can be readily moulded and exhibit a high elasticity, thus enabling new applications for luminous displays and display screens. These layers can be readily manufactured as large-surface, flat and very thin layers for which, in addition, only a small amount of material is necessary. Said layers are characterized by a remarkably high brightness in combination with a small drive voltage.

Besides, the color of the emitted light can be varied in wide ranges from approximately 400 nm to approximately 650 nm by the choice of the luminescent substance. These colors demonstrate a remarkable luminance.

Also combinations of electroconductive organic materials and metallo-organic compounds of the rare earth metals have been used for organic, light-emitting diodes in order to obtain color displays having an improved color purity and exact color points in accordance with the EBU standard. In DE 44 28 450, a description is given of an organic electroluminescent component comprising a multilayer structure including a substrate layer, a first transparent electrode layer, one or more optoelectronically functional layers comprising, optionally, one or more p-conductive organic materials with one or more singlet states and one or more triplet states and comprising a luminescent material including one or more complexes of a rare earth metal ion with organic ligands, said rare earth metal ion having are emitting state and the organic ligands having one or more singlet states and one or more triplet states, and said optoelectronically functional layer(s) further optionally comprising one or more n-conductive, organic materials with one or more singlet states and one or more triplet states and a second electrode, the lowest-energy triplet state of the ligands being lower than the lowest-energy triplet states of the n-conductive and/or p-conductive organic material, and being higher than the emissive state of the rare earth metal ion. The rare earth metal ion may be, for example, a terbium (III) ion.

In these organic light-emitting diodes the layers of p-conductive or n-conductive material and the layer having a complex compound of terbium can be manufactured in a different way. The complex compound of terbium can be dissolved, for example, alone or together with the p-conductive material and the n-conductive material in a matrix of a polymer, for example polycarbonate, polymethacrylate. The complex compound of terbium may alternatively be vapor-deposited, alone or together with the p-conductive and the n-conductive material, in the form of a layer.

In order to be suitable for these manufacturing methods, the complex compound of terbium should be soluble in the non-polar solvents, which dissolve the polymers, and it should be soluble in the polymers themselves. In addition, it should be possible to evaporate and sublimate the complex compound of terbium in an undecomposed state.

SUMMARY OF THE INVENTION

Therefore, it is an object of the invention to provide an organic light-emitting diode comprising a complex compound of terbium with organic ligands, which diode can be readily manufactured.

In accordance with the invention, this object is achieved by an organic light-emitting diode comprising a laminated structure including, in succession, a substrate layer, a first electrode layer, a layer with a p-conductive organic material, a layer including a complex compound of terbium with organic ligands, a layer with an n-conductive material and a second electrode, the complex compound of terbium with organic ligands having the following composition: TbL $(C_2H_5OH)_2$, wherein L=N,N',N"-Tris-(3-$R_1$—,5-$R_2$-2-X-benzyl-1,4,7-triazacyclononane, wherein X =—O—, COO—, $R_1$=CH$_3$, $C_2H_5$, $C_3H_7$, i-$C_3H_7$, t-$C_4H_9$, OCH$_3$, OC$_2$H$_5$, OC$_3$H$_7$, -O(t-$C_4H_9$), F, Cl, Br, NO$_2$ and $R_2$=CH$_3$, $C_2H_5$, $C_3H_7$, i-$C_3H_7$, t-$C_4H_9$, OCH$_3$, OC$_2$H$_5$, OC$_3$H$_7$, -O(t-$C_4H_9$)-F, Cl, Br, NO$_2$.

This neutral terbium complex comprising the macrocyclic chelate ligand L having 1,4,7-triazanonane as the parent substance enables a surprisingly high emission quantum efficiency in the diode to be attained. In addition, the complexes are mononuclear, so that they are readily sublimable in the undecomposed state. In the undecomposed state, they are soluble in non-polar solvents, for example hydrocarbons such as toluol, cyclohexane, halogenated hydrocarbons such as dichloroethane, dichloromethane, chloroform or chlorobenzene, and in polymers such as polyacrylate, polystyrole and the like.

These and other aspects of the invention will be apparent from and elucidated with reference to the embodiments described hereinafter.

Figure 1:
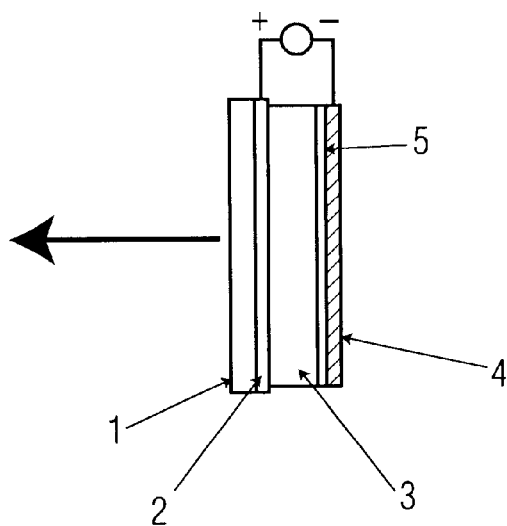
FIG. 1 shows an embodiment of the organic light-emitting diode in accordance with the invention.

In this embodiment, the organic light-emitting diode in accordance with the invention comprises a laminated structure of a substrate layer 1, a first transparent electrode layer 2, a layer 3 with a p-conductive organic material and a luminescent terbium complex, a layer with n-conductive organic material 5 as well as a second electrode 4.

In operation, a d.c. voltage is applied to both electrodes. The first electrode is at a positive potential (anode), the second electrode is at a negative potential (cathode).

For the substrate 1 use is always made of a plate of a light-transmitting material, for example a glass plate. A thin film having a thickness of several 100 nm is provided thereon and serves as the anode 2, which must also be light-transmitting. The following layers are the p-conductive layer comprising the terbium complex and, subsequently, the n-conductive layer. The thickness of these layers ranges between 10 and 100 nm. The organic, electroluminescent component is completed by the cathode 4.

Figure 2:
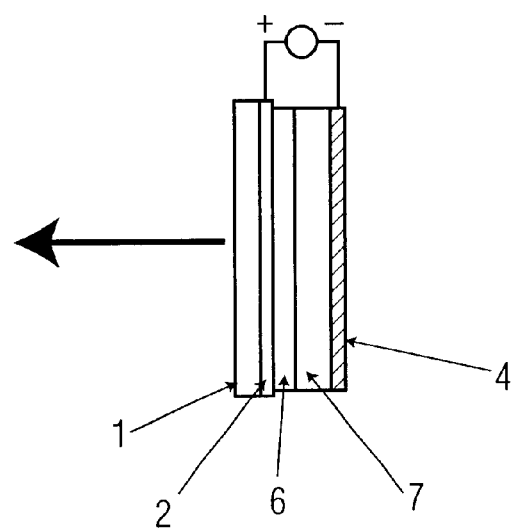

FIG. 2 shows an additional embodiment of the organic light-emitting diode in accordance with the invention. In this embodiment 6 is a layer with a p-conductive material and 7 is a layer with an n-conductive material and a luminescent terbium complex.

Figure 3:
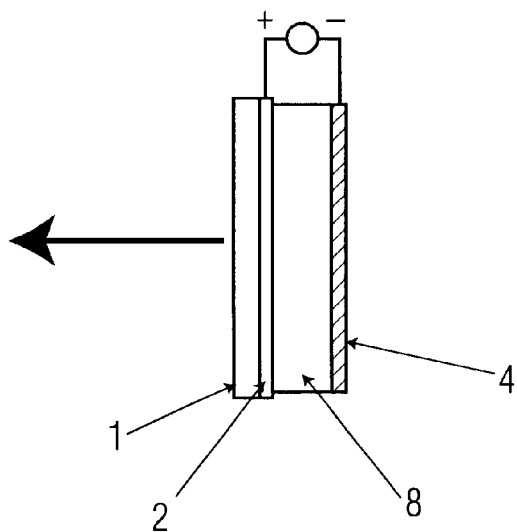

FIG. 3 shows a further embodiment of the organic light-emitting diode in accordance with the invention. In this embodiment 8 is a layer with a p-conductive material, a luminescent terbium complex and an n-conductive material.

Figure 4:
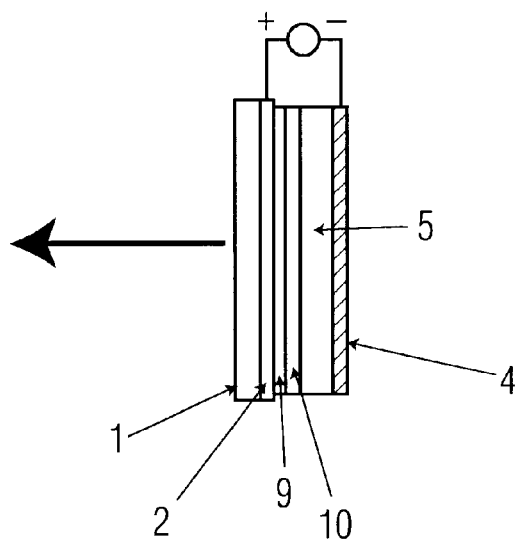

FIG. 4 shows a still further embodiment of the organic light-emitting diode in accordance with the invention. In this embodiment 9 is a layer with a p-conductive material and 10 is a layer with a luminescent terbium complex.

DESCRIPTION OF THE PREFERRED EMBODIMENTS

Materials which can suitably be used for the transparent anode, from which holes are injected into the p-conductive layer, are metals, metal oxides or electroconductive organic polymers having a high work function for electrons. Examples include thin, transparent layers of indium-doped tin oxide (ITO), gold or polyaniline.

For the p-conductive layer use can be made of molecularly-doped organic polymers or intrinsically conductive organic polymers, that is polymers having intrinsic electrical conductivity or conductive organic monomers. An example of an intrinsically p-conductive, organic polymer is poly(N-vinylcarbazole).

Due to their generally infinitely small electrical conductivity, organic polymers are customarily used as insulators or jackets in the electrical and electronic industries. In recent times, however, attempts of modifying the conductivity of organic polymers by means of dopings, i.e. by introducing accurately define impurities, so that they can also serve as current conductors in electronic systems have been successful. Examples of such doped organic polymers are polyacetylene doped with arsenic pentafluoride or iodide. They exhibit a metallic luster.

Another class of doped organic polymers is constituted by the so-called "molecularly doped polymers" (MDP), as described, for example, in P. M. Bausenberger andl D. S. Weiss, "Organic Photoreceptors for Imaging Systems", Marcel Dekker, New York (1993). Said molecularly doped polymers are molecularly dispersed binary solid solutions of monomers, which are capable of transporting electric charges, in inert, inactive polymeric matrix molecules.

A particularly suitable MDP material having p-conductive properties is the solid solution of the p-conductor N,N'-diphenyl-N,N'-bis(3-methylphenyl)-1,1'-biphenyl-4,4'-diamine (TPD) as a dopant in a matrix of polymethyl-metacrylate or bisphenol A -polycarbonate.

For the p-conductive layer, also poly(p-phenylenevinylene) and derivatives thereof can suitably be used. Preferably use is made of conductive triphenylamine derivative,; such as 4,4', 4"-tris(3-methylphenylamino) triphenylamine (MTDATA), N,N'-diphenyl-N,N'-bis(3-methylphenyl)-1,1'-biphenyl-4,4'-diamine (TPD), N,N'-di(4-methylphenyl)-N,N'-diphenyl-1,4-phenylendiamine (DPPD) or 1,1'-bis-(4'-bis-(4'-methylphenyl)-aminophenyl)-cyclohexane (TAPC).

For the electron-transporting layer, which is in contact with the cathode and the mixed layer, use is preferably made of 2-(4-biphenylyl)-5-(tertiary-butylphenyl)-1,3,4-oxadiazole (butyl-PBD), 2-(4-biphenylyl)-5-phenyl-1,3,4-oxadiazole (PBD) or 5-(4-biphenylyl)-3-(tertiary-butylphenyl)-1,2,4-triazole (TAZ).

For the n-conductive layer use is also made of intrinsically conductive organic monomers and polymers or molecularly doped polymers. Intrinsically conductive organic monomers, which can suitably be used for the electron-transporting layer, are 3,4,9,10-perylene-tetracarboxy-bis-benzimidazole, 2-(4-biphenylyl)-5-(tertiary-butylphenyl)-1,3,4-oxadiazole (butyl-PBD), 2-(4-biphenylyl)-5-phenyl-1,3,4-oxadiazole or 2,5-diphenyl- 1,3,4-oxadiazole (PPD) and 8-hydroxy-quinoline-Aluminium ($Alq_3$).

For the n-conductive molecularly doped organic polymer use can be made of a polymethyl methacrylate to which 8-hydroxy-quinoline-aluminium ($Alq_3$) is added.

Other molecularly doped organic polymers which can be used in accordance with the invention are composed, for example, of polymethyl methacrylate (PMMA), polystyrene or bisphenol A-polycarbonate as a matrix, which is doped with oxadiazoles, such as 2-(4-biphenylyl)-5-(tertiary-butylphenyl)-1,3,4-oxadiazole and 2,5-diphenyl-1,3,4-oxadiazole, or triazoles such as 3,4,5-triphenyl-1,2,4-triazole and 3-(4'-t-butylphenyl)-4-phenyl-5-(4"-biphenyl)-1,2,4-triazole.

The elecytroluminescent material comprises the complex compound of terbium with organic ligands having the following composition $TbL(C_2H_5OH)_2$, wherein L=N,N',N"-tris-(3-$R_1$—, 5-$R_2$-2-X-benzyl)-1,4,7-triazacyclononane, wherein X=—O—, —COO—, $R_1$=$CH_3$, $C_2H_5$, $C_3H_7$, i-$C_3H_7$, t-$C_4H_9$, $OCH_3$, $OC_2H_5$, $OCH_3H_7$, -O(t-$C_4H_9$)-F, Cl, Br, $NO_2$ and $R_2$=$CH_3$, $C_2H_5$, $C_3H_7$, i-$C_3H_7$, t-$C_4H_9$, $OCH_3$, $OC_2H_5$, $OC_3H_7$, -O(t-$C_4H_9$)-F, Cl, Br, $NO_2$.

The terbium complexes allow fluorescence in the green spectral region to be achieved.

The macrocyclic, trivalent ligand L comprises 1,4,7-triazacyclononane as the parent substance, which is substituted at each nitrogen atom with a phenol derivative or benzoic acid derivative. Surprisingly it has been found that by using phenolates or benzolates as linkage to the terbium (III) ion, a very efficient energy transfer from the ligand to the metal ion takes place, thus enabling high emission quantum yields to be achieved.

The concentration of the terbium complex should not exceed 20 mol % in order not to influence the transport properties of the conductive organic polymers.

As the material for the cathode use is made of metals having a low work function because electrons must be injected, from the cathode, into the n-conductive layer. Such metals include aluminium, magnesium and alloys of magnesium and silver or indium, as well as calcium, alkali metals, such as Li, Na, K, Cs or rare earth metals such as europium or terbium.

To manufacture the diode, the n- or p-conductive materials can be applied from solution, vapor-deposited in a high vacuum, sublimated or polymerized in situ.

The layer with the terbium complex can be provided by sublimation, optionally, together with the electroconductive organic monomers. When the terbium complex is to be applied together with an electroconductive organic polymer, it is necessary to dissolve both components in a common solvent or solvent mixture so as to form a coating solution.

EXAMPLE

To prepare [(dmnbtacn)Tb($C_2H_5OH$)$_2$], a quantity of 320 mg N,N',N"-tris-)3,5-dimethyl-2-hydroxybenzyl)-1,4,7- triazacyclononane is dissolved in 50 ml ethanol. A quantity of 6 ml of a 0.1 molar $TbCl_3$ solution is added to this solution. Subsequently, also 97.2 mg $NaOCH_3$ are added to this solution. The solution is then stirred for two hours at 60° C., thus forming a white precipitate. The product is sucked off and washed a number of times with a small quantity of ice cold ethanol. The crystalline substance is dried in the desiccator over $CaCl_2$.

The photophysical characterization of the powder of [(dmbtacn)Tb($C_2H_5$OH)$_2$] yielded the following values:

| $Abs_{254}$ [%] | $QE_{254}$ [%] | EX at [nm] | EM at [nm] | τ [ms]* | LE [lm/W] | Color point |
|---|---|---|---|---|---|---|
| 93 | 70 | 322 | 496, 549 590 625 | 0.79 | 515 | x = 0.332 y = 0.603 |

*monoexponential variation

| | Glossary |
|---|---|
| $Abs_{254}$ | absorption at 254 nm |
| EM | maxima in the emission spectrum |
| EX | maxima in the excitation spectrum |
| τ | decay time of the intensity to 1/e |
| LE | lumen equivalent |
| LMCT | ligand-metal-charge-transfer |
| $QE_{254}$ | quantum yield upon excitation with 254 nm-radiation |
| dmbtacn | N,N',N"-tris-(3,5-dimethyl-2-hydroxybenzyl)-1,4,7-triazacyclononane. |

What is claimed is:

1. An organic light-emitting diode which comprises a laminated structure comprising, a substrate layer, a first electrode layer, a layer including a p-conductive material, a layer including a complex compound of terbium with organic ligands, a layer including an n-conductive material and a second electrode, wherein the complex compound of terbium with organic ligands has the following composition: TbL($C_2H_5$OH)$_2$, wherein L=N,N',N"-Tris-(3-$R_1$-, 5-$R_2$-2-X-benzyl)-1,4,7-triazacyclononane, wherein X=—O—, —COO—, $R_1$=$CH_3$, $C_2H_5$, $C_3H_7$, i-$C_3H_7$, t-$C_4H_9$, $OCH_3$, $OC_2H_5$, $OC_3H_7$, O(t-$C_4H_9$), F, Cl, Br, $NO_2$ and $R_2$=$CH_3$, $C_2H_5$, $C_3H_7$, i-$C_3H_7$, t-$C_4H_9$, $OCH_3$, $OC_2H_5$, $OC_3H_7$, O(t-$C_4H_9$), F, Cl, Br, $NO_2$.

2. An organic light-emitting diode as claimed in claim 1 having layers selected from the group consisting of (a) n-conductive material, p-conductive material, and terbium-containing material in separate layers; (b) p-conductive material combined with the terbium-containing material in one layer and the n-conductive material in one layer; (c) n-conductive material and the terbium-containing material in one layer and p-conductive material in one layer; and (d) n-conductive material, p-conductive material, and terbium-containing material combined in one layer.

3. An organic light-emitting diode as claimed in claim 2, having layers that include n-conductive material, p-conductive material, and terbium-containing material in separate layers.

4. An organic light-emitting diode as claimed in claim 2, having layers that include p-conductive material combined with the terbium-containing material in one layer and the n-conductive material in one layer.

5. An organic light-emitting diode as claimed in claim 2, having layers that include n-conductive material and the terbium-containing material containing material in one layer and p-conductive material in one layer.

6. An organic light-emitting diode as claimed in claim 2, having layers that include n-conductive material, p-conductive material, and terbium-containing material combined in one layer.

* * * * *